(12) United States Patent
Hirayanagi

(10) Patent No.: US 6,965,114 B2
(45) Date of Patent: Nov. 15, 2005

(54) APPARATUS AND METHODS FOR MASK/SUBSTRATE ALIGNMENT IN CHARGED-PARTICLE-BEAM PATTERN-TRANSFER

(75) Inventor: Noriyuki Hirayanagi, Kawasaki (JP)

(73) Assignee: Nikon Corporation, Tokyo (JP)

( * ) Notice: Subject to any disclaimer, the term of this patent is extended or adjusted under 35 U.S.C. 154(b) by 19 days.

(21) Appl. No.: 10/227,190

(22) Filed: Aug. 22, 2002

(65) Prior Publication Data

US 2003/0057381 A1 Mar. 27, 2003

Related U.S. Application Data

(63) Continuation of application No. 09/344,734, filed on Jun. 25, 1999, now abandoned.

(30) Foreign Application Priority Data

Jun. 25, 1998 (JP) ........................................... 10-193582

(51) Int. Cl.[7] .............................................. H01J 37/304
(52) U.S. Cl. ................................ 250/491.1; 250/492.1; 250/492.2; 250/492.21; 250/548; 430/22
(58) Field of Search .......................... 250/492.1, 492.2, 250/492.21, 492.22, 492.3, 397, 398, 548, 491.1; 430/22, 30

(56) References Cited

U.S. PATENT DOCUMENTS

| 4,370,554 A | * | 1/1983 | Bohlen et al. ............ 250/491.1 |
| 4,644,172 A | | 2/1987 | Sandland et al. |
| 4,814,829 A | * | 3/1989 | Kosugi et al. ................. 355/43 |
| 4,967,088 A | * | 10/1990 | Stengl et al. ............. 250/491.1 |
| 5,148,036 A | * | 9/1992 | Matsugu et al. ............. 250/548 |
| 5,508,527 A | | 4/1996 | Kuroda et al. |
| 5,674,413 A | * | 10/1997 | Pfeiffer et al. .......... 219/121.25 |
| 5,770,863 A | * | 6/1998 | Nakasuji ................... 250/492.2 |
| 6,171,736 B1 | * | 1/2001 | Hirayanagi ................... 430/22 |
| 6,277,531 B1 | * | 8/2001 | Morita ......................... 430/30 |
| 6,429,090 B1 | * | 8/2002 | Fujiwara et al. ............ 438/401 |

FOREIGN PATENT DOCUMENTS

JP          11-40486          2/1999

* cited by examiner

Primary Examiner—John R. Lee
Assistant Examiner—David A. Vanore
(74) Attorney, Agent, or Firm—Klarquist Sparkman, LLP

(57) ABSTRACT

Methods and apparatus for alignment of masks and wafers in charged-particle-beam (CPB) pattern-transfer use optical position sensors to determine the positions of a mask or a mask stage with respect to an axis of a CPB optical system. The optical position sensor uses optical reference marks provided on the mask or mask stage. Determination of the position of the mask of the mask stage permits a coarse alignment of the mask or the mask stage. CPB reference marks are provided on masks, mask stages, wafers, and wafer stages, permitting alignment of the mask stage or the mask with respect to the wafer stage or wafer, respectively, using the charged particle beam. The charged particle beam is scanned with respect to the wafer or wafer-stage CPB reference marks to determine a deflection corresponding to an alignment of the CPB reference marks of the mask and wafer (or mask stage and wafer stage). Use of the charged particle beam for such alignment permits a fine alignment.

32 Claims, 3 Drawing Sheets

APPARATUS AND METHODS FOR MASK/SUBSTRATE ALIGNMENT IN CHARGED-PARTICLE-BEAM PATTERN-TRANSFER

CROSS-REFERENCE TO RELATED APPLICATIONS

This application is a continuation of application Ser. No. 09/344,734, filed Jun. 25, 1999 now abandoned.

FIELD OF THE INVENTION

The invention pertains to charged-particle-beam pattern-transfer apparatus and methods used, for example, for microlithography of an integrated circuit pattern onto a semiconductor wafer.

BACKGROUND OF THE INVENTION

The increasing level of integration demanded of integrated circuits such as DRAMs has increased the need to transfer high-resolution patterns from a mask to a wafer to create circuits having very small features. Pattern-transfer apparatus using an electron beam are capable of the required high-resolution imaging.

FIG. 4 shows a conventional charged-particle-beam (CPB) pattern-transfer apparatus 40. An electron gun (not shown in FIG. 4) produces an electron beam EB that illuminates a mask 2. A CPB optical system 3 situated on an axis AX projects an image of the circuit pattern defined by the mask 2 onto a wafer 5. The mask 2 and the wafer 5 are retained by respective stages 1, 4 that are provided with respective CPB reference marks 6, 7. The CPB reference mark 6 is typically a small aperture that transmits the electron beam EB. The CPB reference mark 7 includes one or more areas that can reflect the electron beam EB.

To achieve high-resolution pattern transfer, the wafer 5 and the mask 2 must be precisely positioned with respect to each other. To this end, the wafer 5 is positioned with respect to the axis AX of the CPB optical system 3 by mechanically positioning the wafer stage 4 using the wafer-stage CPB reference mark 7. The wafer stage CPB reference mark 7 is illuminated by the electron beam EB, and the reflected (backscattered) electrons produced from such illumination are detected with a backscattered-electron detector 8 that produces an electrical signal used to align the CPB reference mark 7 with the axis AX.

In addition to the CPB reference mark 7, the wafer stage 4 can include optical reference marks. In such a configuration, an optical microscope can be used to perform a coarse alignment of the wafer stage 4 with the axis AX using the optical reference marks prior to the more precise alignment described above using the CPB reference mark 7.

After the wafer stage 4 is positioned as desired, the mask 2 is aligned with the wafer 5. The mask stage 1 positions the mask-stage CPB reference mark 6 near the axis AX to allow the electron beam EB to irradiate the mask-stage CPB reference mark 6. The portion of the electron beam EB transmitted by the mask-stage CPB reference mark 6 is reflected by the wafer-stage CPB reference mark 7 and detected by the backscattered-electron detector 8. Electron-beam deflectors (not shown in FIG. 4) scan the electron beam EB with respect to the wafer-stage CPB mark 7. The amount of deflection that produces a maximum output from the backscattered-electron detector 8 corresponds to an alignment of the mask stage 1 and the wafer stage 4 with each other. This deflection is recorded and used to compute deflections necessary for alignment during subsequent pattern-transfer operations. The alignment of the mask stage 1 with the wafer stage 4 need not be performed each time the wafer 5 is changed.

After alignment of the mask stage 1 with the wafer stage 4 is complete, the mask 2 and wafer 5 are aligned using respective CPB reference marks provided on the mask 2 and wafer 5. (These reference marks are not shown in FIG. 4.) The alignment procedure is similar to that used for aligning the mask stage 1 with the wafer stage 4 using the respective CPB reference marks 6, 7. The deflection of the electron beam EB required to properly align the wafer 5 and the mask 2 is recorded and used to compute the electron-beam deflection and rotation required during subsequent pattern-transfer operations.

The conventional mask-to-wafer alignment method summarized above is adequate for small masks, but with larger masks, the conventional method is unsatisfactory. The dimensions of a large mask are less accurately controlled than those of a small mask so that the location of the mask-stage CPB reference mark 6 relative to the mask 2 is less accurately known. In addition, because the area illuminated by the electron beam EB is small, CPB reference marks can be outside the illuminated area so that alignment based on backscattered electrons from these reference marks is impossible.

In addition, for thin-film electron-scattering masks, the locations of CPB reference marks can change during use. The electron beam EB heats the mask, causing a thermal deformation of the mask. To reduce thermal deformation of the mask, an additional thin film can be deposited on an area surrounding the CPB reference mark to reduce heating. The additional thin film, however, also reduces the positional accuracy of the CPB reference marks. Thus, precise alignment is difficult.

SUMMARY OF THE INVENTION

According to a first aspect of the present invention, charged-particle-beam (CPB) pattern-transfer apparatus are provided that use a charged particle beam to transfer a pattern from a mask or reticle to a substrate such as a resist-coated wafer. The CPB pattern-transfer apparatus comprises an optical mask-measurement system ("optical system") and a CPB mask-measurement system ("CPB system") for determining a relative position of the mask and the substrate. The optical system illuminates an optical reference mark on marks provided on the mask. The CPB system illuminates a CPB reference mark. In one embodiment, the optical reference mark and the CPB reference mark are placed in proximity to each other on the mask. The optical system is situated to perform a coarse alignment of the mask with the substrate. After performing coarse alignment, a fine alignment is performed using the CPB system. In this method, because the coarse mask-positioning alignment is performed using an optical mask-measurement system, the CPB reference mark is automatically placed inside the illumination range of the charged particle beam. Thus, accurate alignment of the mask with the sensitized wafer can be performed, even if the positioning of the CPB reference mark with respect to the perimeter of the mask is imprecise.

In another embodiment, an optical position sensor is situated externally to a column of the CPB optical system of the CPB pattern-transfer apparatus. Such a placement of the optical position sensor simplifies maintenance. The optical position sensor can include a two-dimensional sensor or detector array, such as a charge-coupled device (CCD) or other type of image sensor or position-sensitive detector. A two-dimensional sensor increases a field of view of the optical position sensor and permits a simultaneous determination of mask or mask-stage positions in two dimensions. The optical position sensor can include selectable lenses or a zoom lens to permit adjustment of the field of view of the optical position sensor. With an adjustable field of view, the optical position sensor can be controlled to determine the position of the mask or mask stage even for large displacements of the mask or mask stage from the axis of the CPB optical system. The field of view can be programmatically controlled to locate the mask or mask stage. The field of view can be controlled based on the magnitude of displacement of the mask or mask stage.

According to another aspect of the invention, methods for aligning masks and substrates in CPB pattern-transfer apparatus are provided. In a representative embodiment, a position of a mask (or mask stage) with respect to an axis of a CPB pattern-transfer apparatus is determined using an optical position sensor. A charged particle beam is then used to determine a position of a mask (or mask stage) with respect to a wafer (or wafer stage). The position determined with the optical position sensor is generally less precise than the position obtained using the charged particle beam. Alignment of the mask using the position obtained with the optical position sensor is referred to as a "coarse" alignment while alignment using the charged particle beam is referred to as a "fine" alignment.

In another representative embodiment, a pattern is transferred from a mask to a substrate by mounting the substrate on a substrate stage and aligning the substrate stage with an axis of a charged particle beam. The mask is mounted to a mask stage, and the mask or mask stage is aligned with respect to the axis of the charged particle beam with an optical position sensor. The mask stage or the mask is aligned with respect to the substrate using the charged particle beam.

In an alternative embodiment, the pattern to be transferred to the wafer is defined by several masks. Each mask is aligned using the optical position sensor and the charged particle beam.

The foregoing and other features and advantages of the invention will become more apparent from the following detailed description which proceeds with reference to the accompanying drawings.

DETAILED DESCRIPTION

For convenience, optical systems using visible, ultraviolet, or infrared radiation are referred to herein simply as "optical" systems. Optical systems for use with charged particles such as electrons are referred to as "charged-particle-beam" (CPB) optical systems. CPB optical systems are usually situated so that a charged particle beam (e.g., electron beam or ion beam) propagates within an evacuated chamber to reduce attenuation. The evacuated chamber is referred to herein as the "column" of the CPB optical system.

Figure 1A:
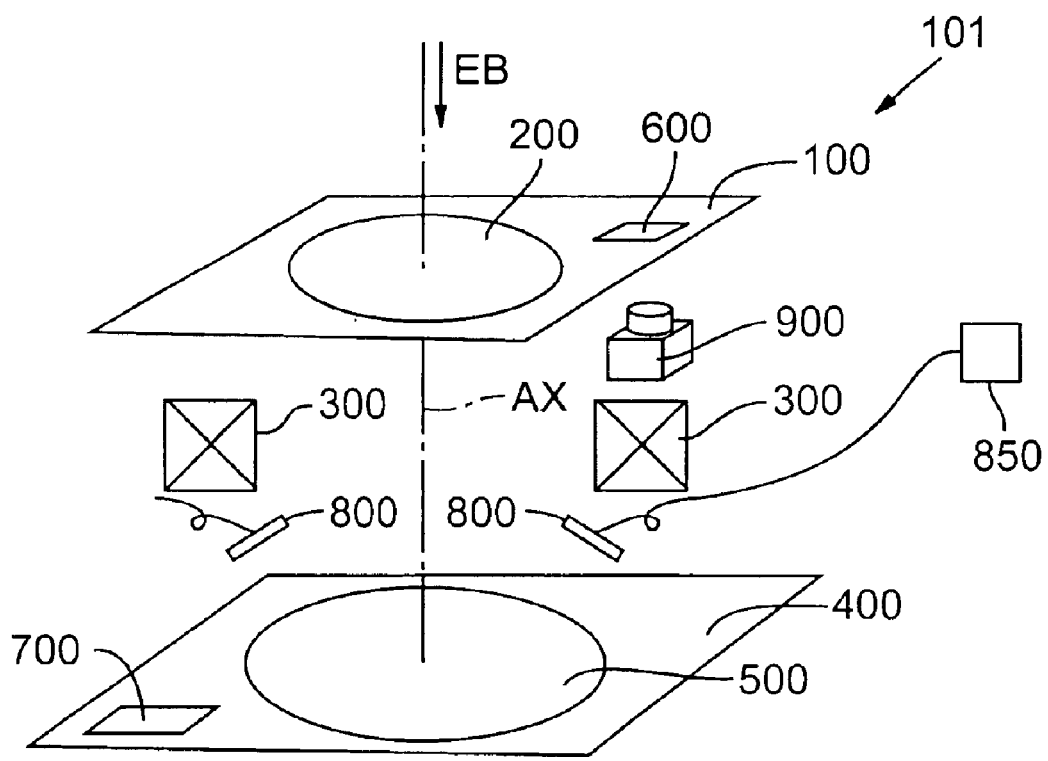
FIG. 1A is a schematic drawing of a charged-particle-beam (CPB) pattern-transfer apparatus.

A representative embodiment is shown in FIG. 1A, in which a CPB pattern-transfer apparatus 101 comprises an electron gun and an illumination optical system (not shown in FIG. 1A) that direct an electron beam EB ("illumination beam") along an axis AX. A CPB optical system 300, situated along the axis AX, for convenience is shown in FIG. 1A as a single magnetic lens, but it will be understood that the CPB optical system 300 generally includes two or more lenses and can include deflectors as well. The electron beam EB irradiates a mask 200 that is retained by a mask stage 100. The CPB optical system 300 forms an image of a pattern or a portion of a pattern defined by the mask 200 onto a wafer 500 or other substrate. The wafer 500 is retained by a wafer stage 400. The mask stage 100 and the wafer stage 400 include a mask-stage reference mark 600 and a wafer-stage reference mark 700, respectively. The CPB pattern-transfer apparatus 101 includes an optical position sensor 900 and a CPB position sensor 850 that includes a backscattered-electron detector 800. The optical position sensor 900 and the CPB position sensor 850 facilitate positioning the mask 200 and the wafer 500 with respect to each other. The mask-stage reference mark 600 includes a CPB-transmissive aperture and the wafer-stage reference mark 700 includes one or more CPB-reflective regions.

The CPB optical system 300 can be partially or completely situated within the CPB column. The optical position sensor 900 can be situated within the CPB column as well but need not be because the optical radiation used by the optical position sensor 900 generally propagates adequately outside the CPB column. Maintenance and repair of the optical position sensor 900 is simpler if the optical position sensor is situated outside the CPB column.

Figure 1B:
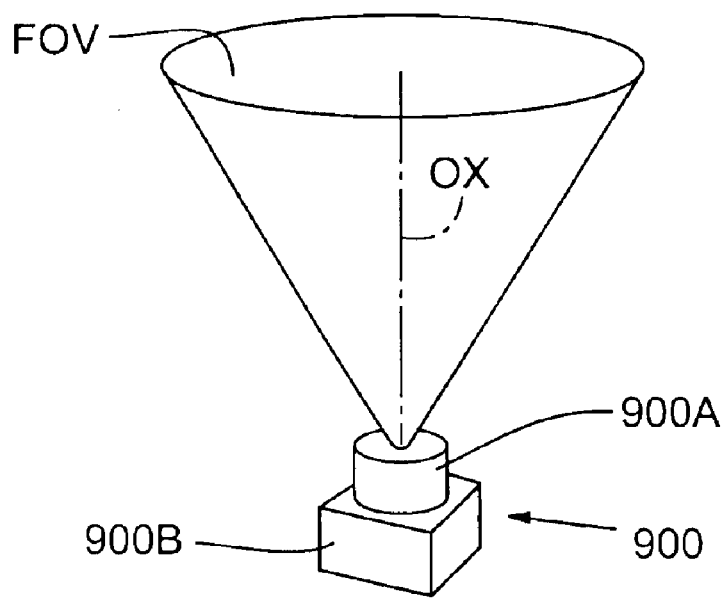
FIG. 1B is a schematic of an optical position sensor of the CPB pattern-transfer apparatus of FIG. 1A.

FIG. 1B shows the optical position sensor 900. The optical position sensor 900 includes a lens 900A that has an optical axis OX and an optical detector 900B. The lens 900A and the optical detector 900B are situated to define a field of view (FOV). If a mask-stage optical reference mark 11 (described below) or other object is situated within the FOV, then the optical position sensor 900 images the mask-stage optical reference mark 11 or other object, respectively, onto the optical detector 900B. The size of the FOV can be changed by replacing or adjusting the lens 900A. For example, a zoom lens can serve as the lens 900A, permitting simple adjustment of the FOV. The optical detector 900B can be, for example, an image sensor such as a charge coupled device (CCD) or a position-sensitive detector (PSD).

Figure 2A:
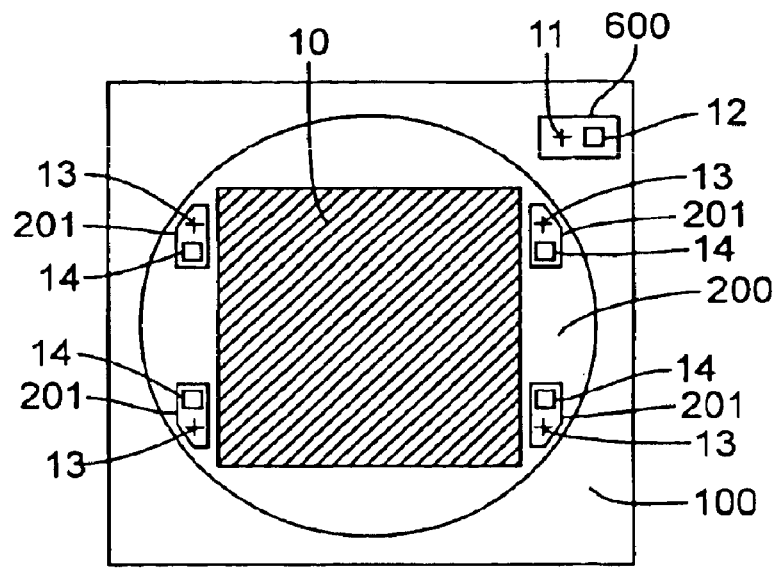
FIG. 2A is a schematic plan view of the mask and mask stage shown in FIG. 1A.

The mask stage 100 and mask 200 are shown in more detail in FIG. 2A. The mask-stage reference mark 600 comprises a mask-stage optical reference mark 11 and a mask-stage CPB reference mark 12. The mask 200 defines a pattern 10 to be partially or completely transferred to the wafer 500 and includes mask reference marks 201. The mask reference marks 201 comprise a mask optical reference mark 13 and a mask CPB reference mark 14. Four mask reference marks 201 are shown in FIG. 2A, but more or fewer can be used. In FIG. 2A, each of the mask reference marks 201 includes a mask optical reference mark 13 and a mask CPB reference mark 14, but other arrangements are satisfactory as well.

In operation, the pattern 10 defined by the mask 200 is illuminated by the electron beam EB and imaged by the CPB optical system 300 onto the wafer 500, thereby exposing a resist layer formed on the wafer 500.

The respective reference marks 600, 700 of the mask stage 100 and the wafer stage 400 facilitate alignment of the mask 200 with the wafer 500.

Alignment of the mask 200 with respect to the wafer 500 is performed as follows. The mask stage 100 is moved so that the mask-stage optical reference mark 11 is within the FOV of the optical position sensor 900, and the position of the mask-stage optical reference mark 11 is measured with respect to the axis AX. The wafer stage 400 is then controllably moved so that the wafer-stage reference mark 700 is positioned on or near the axis AX. The mask stage 100 then positions the mask-stage CPB reference mark 12 near the axis AX, based on the measurement performed using the optical position sensor 900. The electron beam EB illuminates the mask-stage reference mark 600. A portion of the electron beam EB transmitted by the mask-stage CPB reference mark 12 is reflected by the wafer-stage reference mark 700 and detected by the backscattered-electron detector 800. The electron beam EB is scanned with respect to the wafer-stage reference mark 700 to determine a position of the mask-stage CPB reference mark 12 for which the output of the backscattered-electron sensor 800 is maximum. The deflection amount corresponding to this maximum is stored. This deflection corresponds to an alignment of the mask-stage and wafer-stage reference marks 700, 800, respectively.

Because the relative position of the mask-stage optical reference mark 11 with respect to the mask-stage CPB reference mark 12 is fixed, the measurement procedure described above can determine an offset between the wafer-stage reference mark 700 and the axis OX of the optical position sensor 900. By so doing, the position of the optical position sensor 900 relative to the center of the electron beam EB is established. This relative position specifies, for example, an offset between the CPB optical axis AX and the axis OX, and can be used to perform a coarse alignment of the wafer. Such an adjustment is described below. If the relative position of the mask-stage optical reference mark 11 with respect to the mask-stage CPB reference mark 12 is known, then this procedure can be performed using both of the marks 11, 12 or using only one of the marks 11, 12.

This procedure can also be used to measure and correct errors caused by displacements of the optical position sensor 900 due to environmental changes such as temperature. It is generally unnecessary to perform measurements to correct such errors with every wafer change.

Figure 3:
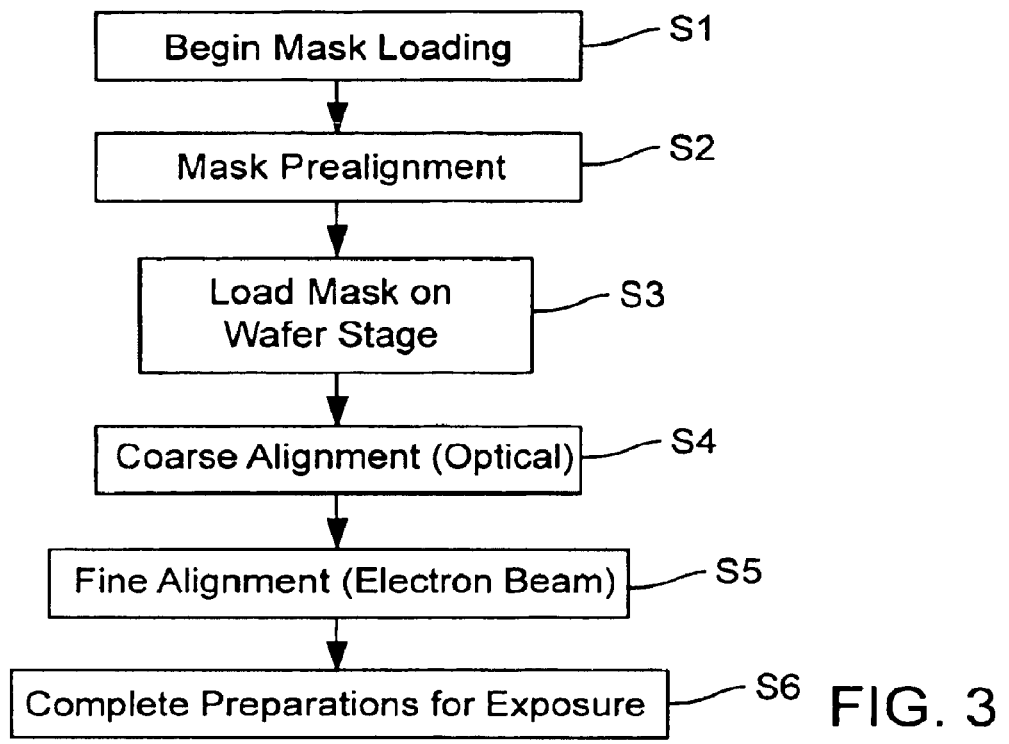
FIG. 3 is a block diagram of a method for aligning a mask and a wafer.
Figure 4:
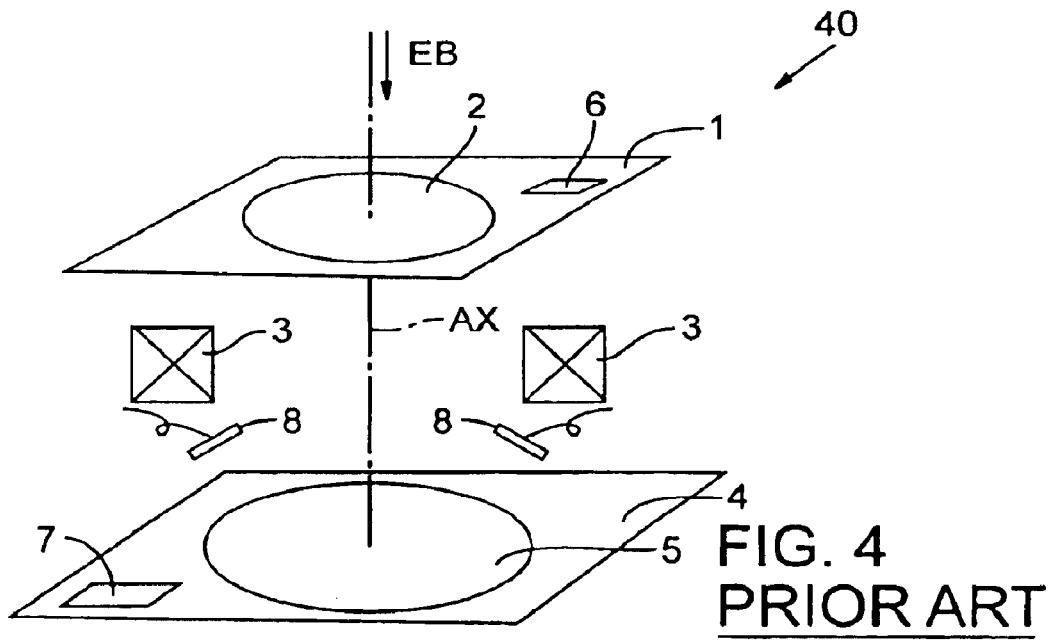
FIG. 4 is a schematic drawing of a conventional electron-beam pattern-transfer apparatus.

FIG. 3 is a block diagram of a mask-alignment process. In a step S1, a control program issues a mask-load command that initiates the loading of the mask 200 onto the mask stage 100 by a mask loader. In a step S2, the mask loader uses a pre-alignment system to position the mask 200 with respect to the mask stage 100 to a selected accuracy. In a step S3, the mask 200 is loaded onto the mask stage 100.

As shown in FIG. 2A, the mask 200 includes one or more mask optical reference marks 13 for use with the optical position sensor 900. Position errors (including rotational errors) of the mask 200 with respect to the axis AX are measured using the optical position sensor 900 and the mask optical reference marks 13. In a step S4, a coarse alignment of the mask 200 is completed by moving the mask stage 100 to reduce these positional errors. A fine alignment is then performed in a step S5 using the electron beam EB and the CPB reference marks as described above. Fine alignment can be carried out using one or more of the mask-stage and mask CPB reference marks 12, 14, respectively, to measure and correct offsets and rotational errors. The deflections and rotations of the electron beam EB are adjusted to correct for the measured errors, thereby completing the fine alignment of the mask 200 with respect to the wafer 500 and wafer stage 400. In a step S6, the CPB pattern-transfer apparatus is prepared to begin pattern transfer.

While the optical position sensor 900 can be located either within or external to the column of the CPB optical system 300, it is generally more convenient to situate the optical position sensor 900 external to the column. In addition, the optical position sensor 900 can include a light source that projects and scans a shaped light beam onto the optical reference marks. The position of the optical reference marks is determined based on the light received from the optical reference marks as a function of the scanning of the shaped light beam.

The use of a two-dimensional sensor as the optical detector 900B eliminates moving parts, enables detection over a large FOV, and permits making adjustments in two directions simultaneously. For example, the optical detector 900B can be a two-dimensional sensor (image sensor) such as a charged-coupled device (CCD) or a position-sensitive detector (PSD).

If the optical position sensor 900 has an adjustable FOV, optical reference marks can be located even if the marks are located well outside of the usual field of view. The FOV can be automatically or manually enlarged for an initial coarse alignment. After the initial coarse alignment, the FOV can be made smaller, and another coarse alignment performed. The FOV can be adjusted as required by changing the lens 300 or using a zoom lens for the lens 300.

Figure 2B:
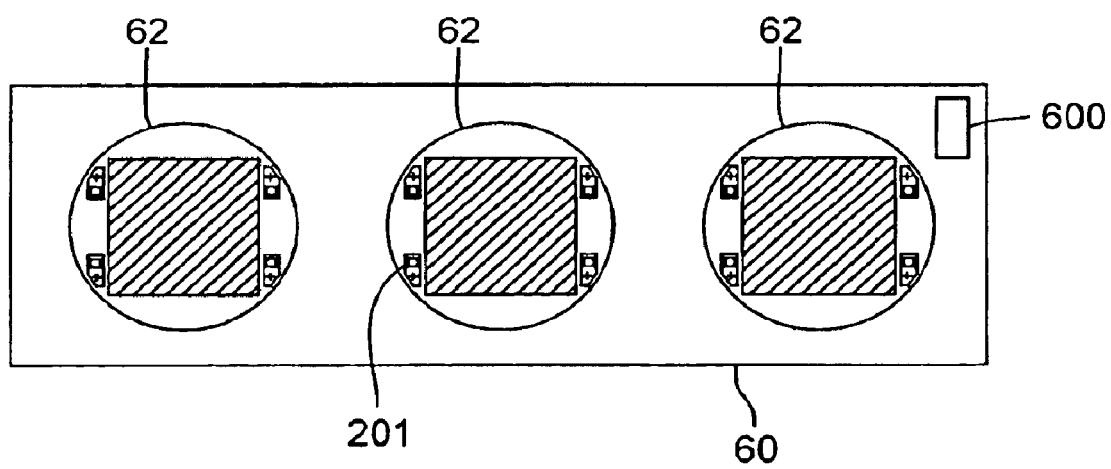
FIG. 2B is a schematic plan view of a mask stage that retains a plurality of masks.

As discussed above, the pattern to be transferred to the wafer 500 is usually defined by a single mask 200. However, certain elements of the pattern can be defined using multiple masks, with each individual mask being aligned as described above. With reference to FIG. 2B, a plurality of the masks 62 can be mounted on a mask stage 60. Each of the masks 62 can be similar to the mask 200 and can include mask reference marks 201 as shown in FIG. 2A. The mask stage 60 can include a mask-stage reference mark such as the mask-stage reference mark 600 of FIG. 2A. Alternatively, a single mask can be divided into multiple subfields each defining a portion of a pattern to be transferred. One or more (or all) of the subfields can include a subfield-reference mark that includes a subfield optical reference mark and a subfield CPB reference mark. A single reference mark can be provided and used to align any of the subfields. The subfields can be coarsely aligned using the subfield optical reference mark and an optical position sensor. A fine alignment can be performed using the subfield CPB reference marks and a backscattered-electron detector.

Whereas the invention has been described in connection with example embodiments, it will be understood that the invention is not limited to these embodiments. On the contrary, the invention is intended to encompass all alternatives, modifications, and equivalents as may be included within the spirit and scope of the invention as defined by the appended claims.

What is claimed is:

1. A charged-particle-beam (CPB) pattern-transfer apparatus, comprising:
   a CPB source situated to irradiate a pattern defined on a mask retained by a mask stage;
   a CPB optical system having an optical axis and being configured to transfer the pattern from the mask to a substrate retained on a substrate stage;

an optical position sensor fixed relative to the optical axis of the CPB optical system, the optical position sensor being configured to receive optical radiation from at least one optical reference mark on the mask or the mask stage and to indicate a displacement of the at least one optical reference mark, and thus of the mask or mask stage, with respect to the optical axis of the CPB optical system; and a CPB position sensor configured to receive CPB radiation that has propagated from at least one CPB reference mark on the mask or mask stage to a reference mark on the substrate or substrate stage and to indicate a displacement of the at least one CPB reference mark with respect to the optical axis of the CPB optical system.

2. The CPB pattern-transfer apparatus of claim 1, further comprising a mask stage controller in communication with the optical position sensor and the mask stage and configured to align the mask with respect to the optical axis of the CPB optical system based on the displacement of the at least one alignment mark indicated by the optical position sensor.

3. The CPB pattern-transfer apparatus of claim 1, wherein the optical position sensor is a two-dimensional sensor.

4. The CPB pattern-transfer apparatus of claim 1, wherein the optical position sensor has an adjustable field of view.

5. The CPB pattern-transfer apparatus of claim 1, wherein the CPB optical system has a column and the optical position sensor is situated external to the column of the CPB optical system.

6. The CPB pattern-transfer apparatus of claim 5, wherein the optical position sensor is a two-dimensional sensor.

7. The CPB pattern-transfer apparatus of claim 6, wherein the optical position sensor has an adjustable field of view.

8. The CPB pattern-transfer apparatus of claim 5, wherein the optical position sensor has an adjustable field of view.

9. The CPB pattern-transfer apparatus of claim 5, wherein the optical position sensor includes an image sensor and an optical system that is configured to form an image of the at least one alignment mark at the image sensor.

10. The CPB pattern-transfer apparatus of claim 5, wherein the optical position sensor includes a light source that produces and scans a shaped light beam onto the at least one alignment mark.

11. In a method for transferring a pattern from a mask to a substrate using a charged particle beam propagating through a charged-particle-beam (CPB) optical system, a mask-substrate alignment method, comprising:

mounting the substrate on a substrate stage, wherein at least one of the substrate and substrate stage includes a substrate reference mark;

mounting the mask, defining at least a portion of the pattern, on a mask stage, wherein at least one of the mask and mask stage includes an optical mask reference mark and a CPB mask reference mark, the mask reference marks having a defined spacing therebetween;

using an optical sensor having an optical axis at a fixed location relative to an optical axis of the CPB optical system, receiving optical radiation from the optical mask reference mark and determining a displacement of the mask or mask stage from the optical axis of the CPB optical system based on the received optical radiation;

based on the determined displacement, moving the mask to place the CPB mask reference mark in the vicinity of the optical axis of the CPB optical system, and moving the substrate to place the substrate reference mark in the vicinity of the optical axis of the CPB optical system; and receiving CPB radiation interacting with the CPB mask reference mark and substrate reference mark, and aligning the mask or mask stage and the substrate or substrate stage with respect to the optical axis of the CPB optical system.

12. The method of claim 11, wherein the mask stage or the mask is aligned with the axis of the CPB optical system by translation of the mask stage or the mask, respectively.

13. The method of claim 11, wherein the mask stage and the substrate stage are aligned with respect to each other based on a portion of the charged particle beam transmitted by at least one CPB mask reference mark on the mask stage and backscattered by at least one CPB reference mark on the substrate stage.

14. The method of claim 11, wherein the mask and the substrate are aligned with respect to each other based on a portion of the charged particle beam transmitted by at least one CPB mask reference mark on the mask and backscattered by at least one CPB reference mark on the substrate.

15. The method of claim 11, wherein the mask and the substrate stage are aligned with respect to each other based on a portion of the charged particle beam transmitted by at least one CPB mask reference mark on the mask and backscattered by at least one CPB reference mark on the substrate stage.

16. The method of claim 11, wherein the mask stage and the substrate are aligned with respect to each other based on a portion of the charged particle beam transmitted by at least one CPB mask reference mark on the mask stage and backscattered by at least one CPB reference mark on the substrate.

17. The method of claim 11, wherein the displacement of the mask from the axis of the CPB optical system is determined, at least in part, based on an image of the optical mask reference mark on the mask or the mask stage.

18. The method of claim 11, wherein the displacement of the mask from the axis of the CPB optical system is determined, at least in part, by scanning a shaped optical beam onto the optical mask reference mark on the mask or the mask stage.

19. A method of manufacturing a semiconductor device, comprising:

aligning a mask and a substrate using the method of claim 11; and transferring a pattern from the mask to the substrate using a charged particle beam.

20. A semiconductor device, manufactured according to the method of claim 19.

21. The method of claim 11, further comprising, responsively to receiving the CPB radiation interacting with the CPB mask reference mark and the substrate reference mark, imposing a deflection to the charged particle beam to achieve exposure of the pattern at a desired location on the substrate.

22. The method of claim 11, wherein receiving radiation from the optical mask reference mark comprises:

directing a light beam to the optical mask reference mark; and receiving light of the beam from the optical mask reference mark into a field of view of an optical detector of the optical sensor.

23. In a method for transferring a pattern from a mask to a substrate using a charged particle beam propagating through a charged-particle-beam (CPB) optical system, a mask-substrate alignment method, comprising:

mounting the mask, defining at least a portion of the pattern, on a mask stage, wherein at least one of the mask and mask stage includes an optical mask reference mark and a CPB mask reference mark, the mask reference marks having a defined spacing therebetween;

using an optical sensor having an optical axis at a fixed location relative to an optical axis of the CPB optical system, receiving optical radiation from the optical mask reference mark and determining a displacement of the mask or mask stage from the optical axis of the CPB optical system based on the received optical radiation;

based on the determined displacement, moving the mask stage to place the CPB mask reference mark in the vicinity of the optical axis of the CPB optical system; and receiving CPB radiation from the CPB mask reference mark and aligning the mask or mask stage and the substrate with respect to the optical axis of the CPB optical system.

24. In a method for transferring a pattern from a mask to a substrate using a charged particle beam propagating through a charged-particle-beam (CPB) optical system, a mask-substrate alignment method, comprising:

using an optical sensor having an optical axis at a fixed location relative to an optical axis of the CPB optical system, receiving optical radiation from an optical mask reference mark associated with the mask, and determining a displacement of the mask or mask stage from the optical axis of the CPB optical system based on the received optical radiation;

based on the determined displacement, moving a CPB mask reference mark, associated with the mask, to a location in the vicinity of the optical axis of the CPB optical system; and receiving CPB radiation from the CPB mask reference mark and aligning the mask and the substrate with respect to the optical axis of the CPB optical system.

25. In an apparatus for transferring a pattern, defined on at least one mask, to a substrate using a charged particle beam passing through a charged-particle-beam (CPB) optical system, a mask-substrate alignment system comprising:

an optical position sensor having an optical axis that is fixed relative to an optical axis of the CPB optical system, the optical position sensor being situated and configured to receive optical radiation from at least one optical mask reference mark associated with the mask and to determine a displacement of the at least one optical mask reference mark from the optical axis of the CPB optical system; and a CPB position sensor situated and configured to receive CPB radiation interacting with at least one CPB reference mark associated with the mask and with a reference mark associated with the substrate and to determine a displacement of the at least one CPB reference mark with respect to the optical axis of the CPB optical system.

26. In an apparatus for transferring a pattern, defined on at least one mask, to a substrate using a charged particle beam passing through a charged-particle-beam (CPB) optical system, a mask-substrate alignment system comprising:

a coarse-alignment device comprising an optical position sensor of which an optical axis is fixed relative to an optical axis of the CPB optical system, the optical position sensor being situated and configured to receive optical radiation from at least one optical mask reference mark associated with the mask and to determine displacement of the at least one optical mask reference mark from the optical axis of the CPB optical system, the determination serving as a coarse determination of mask position relative to the optical axis of the CPB optical system; and a fine-alignment device comprising a CPB position sensor situated and configured to receive CPB radiation interacting with at least one CPB reference mark associated with the mask and with a reference mark associated with the substrate and to determine displacement of the at least one CPB reference mark with respect to the optical axis of the GPB optical system, the determination serving as a fine determination of mask position relative to the optical axis of the CPB optical system and of mask position and substrate position relative to each other.

27. The system of claim 26, further comprising a mask stage and a substrate stage configured, responsively to the coarse determination, to position the CPB reference mark associated with the mask and the reference mark associated with the substrate, respectively, to interact with the CPB radiation.

28. In an apparatus for transferring a pattern, defined on at least one mask, to a substrate using a charged particle beam passing through a charged-particle-beam (CPB) optical system, a mask-substrate alignment system comprising:

optical coarse-alignment means comprising optical position-sensing means, fixed relative to an optical axis of the CPB optical system, for receiving optical radiation from at least one optical mask reference mark associated with the mask and determining displacement of the at least one optical mask reference mark from the optical axis of the CPB optical system, the determination serving as a coarse determination of mask position relative to the optical axis of the CPB optical system; and CPB fine-alignment means comprising CPB position-sensing means for receiving CPB radiation interacting with at least one CPB reference mark associated with the mask and with a reference mark associated with the substrate and for determining displacement of the at least one CPB reference mark with respect to the optical axis of the CPB optical system, the determination serving as a fine determination of mask position relative to the optical axis of the CPB optical system and of mask position and substrate position relative to each other.

29. The system of claim 28, further comprising mask-stage means and substrate-stage means for respectively positioning, responsively to the coarse determination, the CPB reference mark associated with the mask and the reference mark associated with the substrate to interact with the CPB radiation.

30. In a method for transferring a pattern from a mask to a substrate using a charged particle beam propagating through a charged-particle-beam (CPB) optical system, a mask-substrate alignment method, comprising:

mounting a plurality of masks, each defining a respective portion of the pattern, on a mask stage, wherein at least one respective optical mask reference mark and at least one respective CPB mask reference mark are associated with each mask;

using an optical sensor situated at a fixed location relative to an optical axis of the CPB optical system, receiving optical radiation from the optical mask reference mark of a selected mask, and determining a displacement of the selected mask or the mask stage from the optical axis of the CPB optical system based on the received optical radiation;

based on the determined displacement, moving the mask to place the CPB mask reference mark of the selected mask in the vicinity of the optical axis of the CPB optical system; and receiving CPB radiation from the CPB mask reference mark of the selected mask, and aligning the selected mask with respect to the optical axis of the CPB optical system.

31. The method of claim 30, further comprising aligning the selected mask or the mask stage with respect to the substrate based on a portion of the charged particle beam transmitted by the CPB mask reference mark associated with the selected mask and backscattered from at least one CPB reference mark associated with the substrate.

32. The method of claim 30, further comprising:

mounting the substrate on a substrate stage; and aligning the selected mask and the substrate stage with respect to each other based on a portion of the charged particle beam transmitted by the CPB mask reference mark on the selected mask and backscattered by at least one CPB reference mark on the substrate stage.

* * * * *